US006995997B2

(12) United States Patent
Ferrant

(10) Patent No.: US 6,995,997 B2
(45) Date of Patent: Feb. 7, 2006

(54) CACHE CELL WITH MASKING

(75) Inventor: Richard Ferrant, Esquibien (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/862,057

(22) Filed: Jun. 4, 2004

(65) Prior Publication Data

US 2004/0252536 A1 Dec. 16, 2004

Related U.S. Application Data

(63) Continuation of application No. 10/672,928, filed on Sep. 26, 2003, now abandoned, which is a continuation of application No. 10/337,228, filed on Jan. 6, 2003, now abandoned, which is a continuation of application No. 10/142,367, filed on May 9, 2002, now abandoned, which is a continuation of application No. 09/946,148, filed on Sep. 4, 2001, now abandoned.

(30) Foreign Application Priority Data

Sep. 4, 2000 (FR) .......................................... 00 11242

(51) Int. Cl.
*G11C 15/00* (2006.01)

(52) U.S. Cl. ..................... 365/49; 365/154; 365/156; 711/108

(58) Field of Classification Search .................. 365/49, 365/154, 156; 711/108
See application file for complete search history.

(56) References Cited

U.S. PATENT DOCUMENTS 5,422,838 A 6/1995 Lin
5,642,114 A 6/1997 Komoto et al.
6,044,005 A 3/2000 Gibson et al.
6,295,576 B1 9/2001 Ogura et al.
6,341,079 B1 * 1/2002 Chadwick ..................... 365/49
6,480,931 B1 * 11/2002 Buti et al. ................... 711/108

FOREIGN PATENT DOCUMENTS

EP 198 39 205 A1 3/1999

OTHER PUBLICATIONS

Preliminary French Search Report from French Patent Application No. 00/11242, filed Sep. 4, 2000.
European Search Report from related European Patent Application No. 01 41 0110.
Patent Abstracts of Japan, vol. 1996, No. 05, May 31, 1996 & JP 08 007580 A (Hitachi Ltd.) Jan. 12, 1996.
Patent Abstracts of Japan, vol. 013, No. 537, Nov. 30, 1989 & JP 01 220293 A (NEC Corp) Sep. 1, 19896.

* cited by examiner

*Primary Examiner*—Richard Elms
*Assistant Examiner*—N. Nguyen
(74) *Attorney, Agent, or Firm*—Lisa K. Jorgenson; James H. Morris; Wolf, Greenfield & Sacks, P.C.

(57) ABSTRACT

A CAM cell with masking made in the form of an integrated circuit, including a first storage cell including a first transistor, first and second inverters in anti-parallel, and a second transistor; a comparison cell, including third and fourth transistors controlling a fifth transistor, connected in series with a sixth inhibiting transistor to a result line; and a second storage cell, including a seventh transistor in series with two inverters in anti-parallel and an eighth transistor, the second storage cell controlling the inhibiting transistor. The first, second, seventh, and eighth transistors may be N-channel transistors, and the third, fourth, fifth, and sixth transistors may be P-channel transistors.

3 Claims, 5 Drawing Sheets

CACHE CELL WITH MASKING

This application is a continuation of prior application Ser. No.: 10/672,928, filed Sep. 26, 2003, now abandoned, which in turn is a continuation of prior application Ser. No. 10/337,228, filed Jan. 6, 2003, now abandoned, which in turn is a continuation of prior application Ser. No. 10/142,367, filed May 9, 2002, now abandoned, which in turn is a continuation of prior application Ser. No. 09/946,148; filed on Sep. 4, 2001, now abandoned, entitled CACHE CELL WITH MASKING which applications are incorporated herein by reference.

BACKGROUND OF THE INVENTION

1. Field of the Invention

The present invention relates to a cell of a cache memory array, currently designated in the art as a CAM (Content Addressed Memory), and more specifically to such a cell provided with a masking element.

2. Discussion of the Related Art

FIG. 1 shows a conventional CAM cell above dash and dot line 1. This cell is associated with two complementary bit lines BL1 and $\overline{BL1}$, shown vertically, with a word line WL1 shown horizontally, and with a result line $\overline{MATCH}$ shown horizontally. The bit lines are common to cell columns, and the word and result lines are common to cell rows.

The CAM cell includes a storage element and a comparison element.

The storage element includes, between lines BL1 and $\overline{BL1}$, the series connection of a MOS transistor T1, of two anti-parallel inverters INV1 and INV2, and of a MOS transistor T2. The gates of transistors T1 and T2 are connected to word line WL1. To store a state, a 1 is placed on word line WL1. Both transistors T1 and T2 are then on and points ST and $\overline{ST}$ located on either side of the inverters take, respectively, the states existing on lines BL1 and $\overline{BL1}$. Word line WL1 is then reset to zero, transistors T1 and T2 are turned off and the state of points ST and $\overline{ST}$ is stored.

The comparison element includes two MOS transistors NB and NA in series between lines BL1 and $\overline{BL1}$. Connection point CMP of these two transistors is connected to the gate of a transistor NC connected between a result line $\overline{MATCH}$ and the ground. In a comparison step, line WL1 is maintained at zero and lines BL1 and $\overline{BL1}$ are set to the state which is desired to be compared to the previously stored state. It can be seen that, if the stored state is reproduced on lines BL1 and $\overline{BL1}$, point CMP is at a low level (0) and transistor NC is off. The state of result line $\overline{MATCH}$ (which is maintained at a high voltage Vdd by a resistor or any other means for setting to the high state) is thus not modified. In fact, since line $\overline{MATCH}$ is connected to all the cells in a same row, it is thus checked whether a word to be compared is identical or not to a preceding word. However, if a bit of a word to be compared differs from the corresponding bit of the stored word, point CMP of the corresponding cell switches high, the corresponding transistor NC turns on and line $\overline{MATCH}$ changes state and switches to zero.

FIG. 1 shows, under a compound line 1, circuit elements enabling inhibition ("masking") of a cell. Indeed, it is desired to be able to compare words, some bits of which are indifferent. To achieve this result, an additional transistor ND is provided between transistor NC and the ground. Transistor ND is made permanently conductive when the comparison of the involved cell is effectively desired to be validated and is permanently blocked when the comparison is desired to be inhibited. Indeed, in this latter case, whatever the state of transistor NC, the ground connection of result line $\overline{MATCH}$ for the involved cell is permanently open. To control transistor ND, a storage cell including transistors T3 and T4 and inverters INV3 and INV4, similar to the components of the previously-described storage element of the CAM cell but arranged between bit lines BL2 and $\overline{BL2}$ and associated with a word line WL2, is provided.

As shown in FIG. 2, an inverter includes two complementary MOS transistors in series between a high voltage source VDD and ground GND, input E of the inverter corresponding to the common gates of these transistors and output S of the inverter corresponding to the common terminal of the two transistors. Thus, the circuit of FIG. 1 includes 16 MOS transistors: 12 N-channel transistors and 4 P-channel transistors.

FIG. 3 very schematically illustrates the shape of an elementary MOS transistor. This transistor includes, on either side of a gate G, heavily-doped source and drain regions of a first conductivity type, formed in a substrate of the opposite conductivity type. The active areas are separated from one another by thick oxide regions ($SiO_2$). The transistor of FIG. 3 is an N-channel transistor. The P-channel transistors have a similar structure, all conductivity types being inverted. This means that they are formed in an N-type substrate or well. The N wells in which the P-channel transistors are formed must be at a non-negligible distance from the limit of the closest N-type transistors. This leads to gathering all the P-type transistors in a common well.

FIG. 4 shows in top view an example of implementation in the form of an integrated circuit of the circuit of FIG. 1. All the P-type transistors, that is, the P-type transistors of inverters INV1 to INV4, are gathered in a same well 10.

FIG. 4 is extremely simplified. The active areas of the transistors are shown as white rectangles. The polysilicon layers that form gates at the locations where they cut the active areas are hatched. The reference of each transistor is shown at the location where the gate of this transistor covers its active area. The areas of contact with the various regions are marked with a cross. The connections between transistor terminals, when not ensured by an extension of an active area, are indicated by dotted lines. In practice, these connections will be ensured by one or the other of various metallization levels formed on the integrated circuit. The two transistors of a same inverter INV are designated by a same reference I. For example, the N-channel and P-channel transistors of inverter INV2 are both designated by reference I2, it being understood that the transistor designated by reference I2 arranged in well 10 is a P-channel transistor and that the transistor designated by reference I2 external to well 10 is an N-channel transistor.

As illustrated in FIG. 4, transistors T1 and T2, N-channel transistors I1 and I2 of inverters INV1 and INV2, and transistors NA and NB are arranged at the top of the drawing, above well 10. Transistors NC and ND, N-channel transistors I3 and I4 of inverters INV3, INV4, and transistors T3 and T4 are arranged at the bottom of the drawing, under well 10. This arrangement corresponds to an optimization of the circuit resulting from many improvements performed by specialized designers.

Experience shows that, for example in a line such as line HCMOS8 of STMicroelectronics, in which the minimum dimension of a pattern is 0.18 $\mu$m, a structure having a 23.5-$\mu m^2$ surface area is obtained. With a line of type HCMOS9 in which the minimum dimension of a pattern is 0.12 μm, a 12-μm² surface area is obtained. Such surface areas are not compressible due to the minimum guard distances to be maintained between the different components and the metallizations connecting them. It should in particular be noted that one of the factors that take a great part in the surface area of an integrated circuit results from the provision of connection areas or connection pads from which vias will be grown and on which it will be possible to perform a connection with metallizations.

SUMMARY OF THE INVENTION

An object of the present invention is to provide a CAM memory circuit with masking that can be made in the form of an integrated circuit with a smaller surface area than prior art circuits.

To achieve this and other objects, the present invention provides modifying the circuit of the prior art so that it includes an equal number of N-channel transistors and of P-channel transistors. Thus, the present invention provides maintaining N-channel transistors for the storage cell transistors and providing P-channel transistors for the other transistors.

More specifically, the present invention provides a CAM cell with masking made in the form of an integrated circuit, including a first storage cell arranged between two first bit lines, and including, in series, a first transistor, first and second inverters in anti-parallel, and a second transistor, the gates of the first and second transistors being connected to a first word line; a comparison cell, including third and fourth transistors arranged between the first bit lines, the connection point of the third and fourth transistors controlling a fifth transistor, connected in series with a sixth inhibiting transistor between a result line and a bias voltage; and a second storage cell, including between second bit lines a seventh transistor in series with two inverters in anti-parallel and an eighth transistor, the second storage cell controlling the inhibiting transistor. According to the present invention, the first, second, seventh, and eighth transistors are transistors having a channel of a first type, and the third, fourth, fifth, and sixth transistors are transistors with a channel of the opposite type.

According to an embodiment of the present invention, the transistors having a channel of opposite type are P-channel transistors and are formed in a same N well.

According to an embodiment of the present invention, the first, second, seventh, and eighth transistors, as well as the N-channel transistors of the inverters, are formed in a substantially aligned way, and the P-channel transistors, as well as the P-channel transistors of the inverters, are formed in a substantially aligned way.

The foregoing objects, features and advantages of the present invention, will be discussed in detail in the following non-limiting description of specific embodiments in connection with the accompanying drawings.

DETAILED DESCRIPTION

Figure 5:
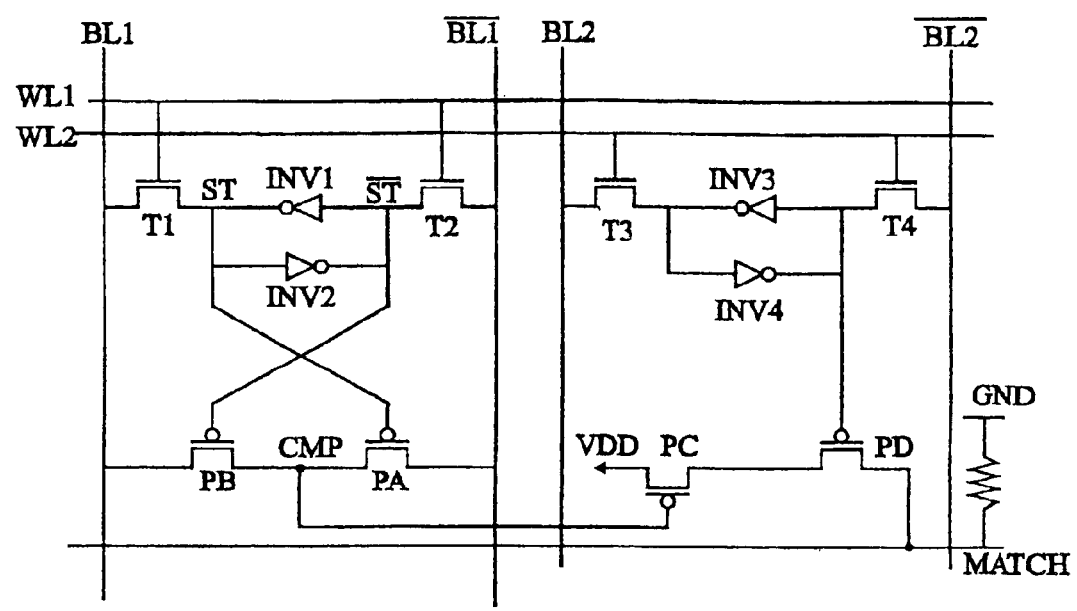
FIG. 5 shows a diagram of a CAM cell with masking according to the present invention.

FIG. 5 shows a diagram of a CAM cell circuit with masking according to the present invention. In this diagram, the transistors are shown as much as possible in the vicinity of the locations where they will be formed in an integrated circuit, as described hereafter in relation with FIG. 6.

Figure 1:
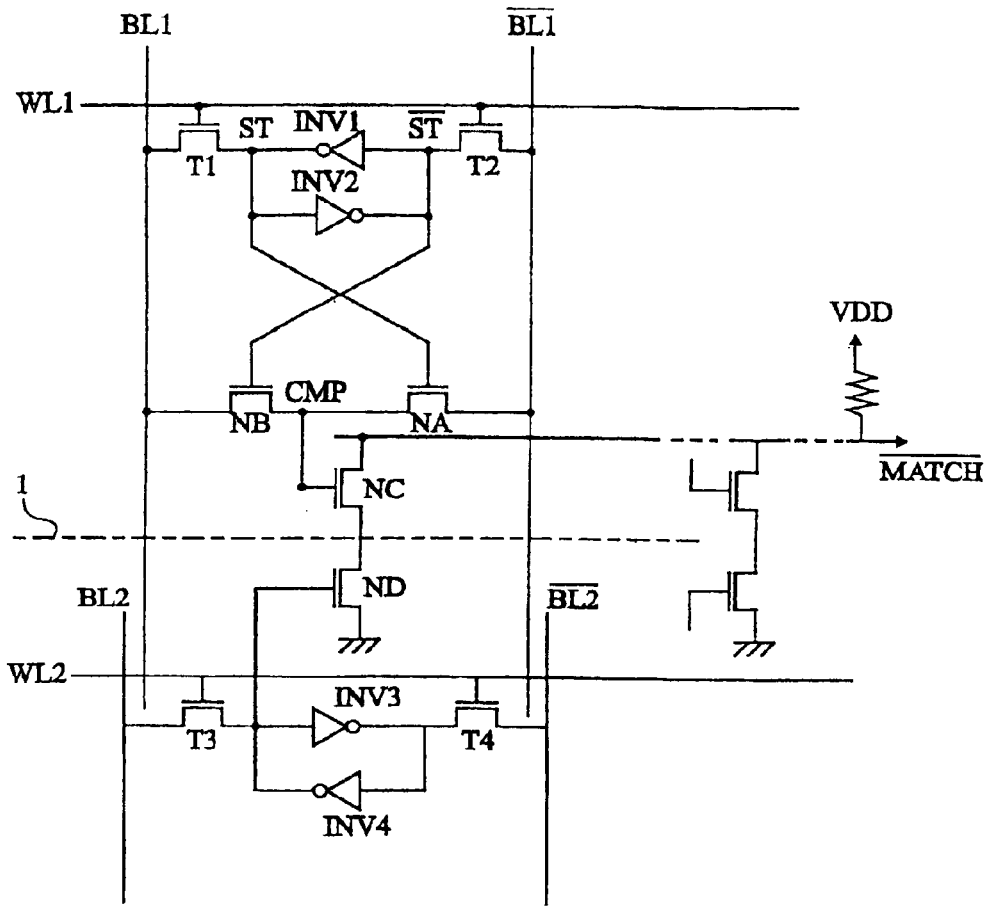
FIG. 1 shows a conventional CAM cell with masking.
Figure 2:
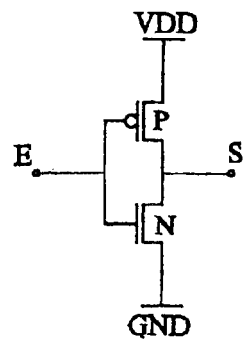
FIG. 2 shows the connections of an inverter.
Figure 3:
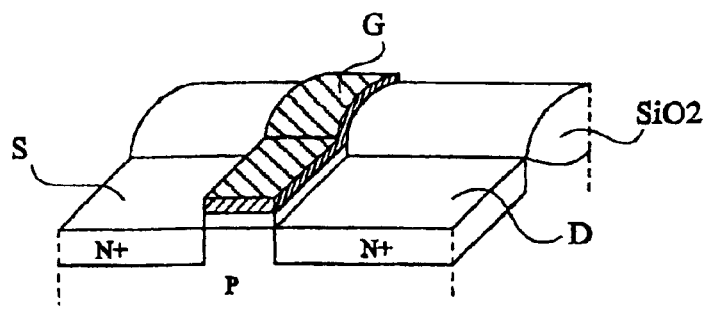
FIG. 3 shows a simplified partial perspective view of an N-channel MOS transistor.

In FIG. 5, transistors T1 and T2 and inverters INV1 and INV2 are assembled as previously between bit lines BL1 and $\overline{BL1}$, and the gates of transistors T1 and T2 are connected to a word line WL1. Transistors T3, T4 and inverters INV3, INV4 are connected as previously between bit lines BL2 and $\overline{BL2}$ and the gates of the transistors are connected to a word line WL2. However, in this drawing, the second storage cell is shown next to the first one and not under it as in the case of FIG. 1. N-channel MOS transistors NA and NB of FIG. 1, connected between lines BL1 and $\overline{BL1}$, are replaced with P-channel MOS transistors PA and PB. Connection point CMP is connected to a P-channel MOS transistor PC instead of N-channel MOS transistor NC. P-channel MOS transistor PC is connected in series with a P-channel MOS transistor PD between reference voltage Vdd and a result line MATCH. The result line is designated as MATCH and not $\overline{MATCH}$ as in the case of FIG. 1, given that the result is inverted with respect to the case of FIG. 1. In FIG. 1, a matching translates as the fact for line $\overline{MATCH}$ to be at 1. Now, a matching is revealed by the fact that line MATCH is at 0.

Figure 6:
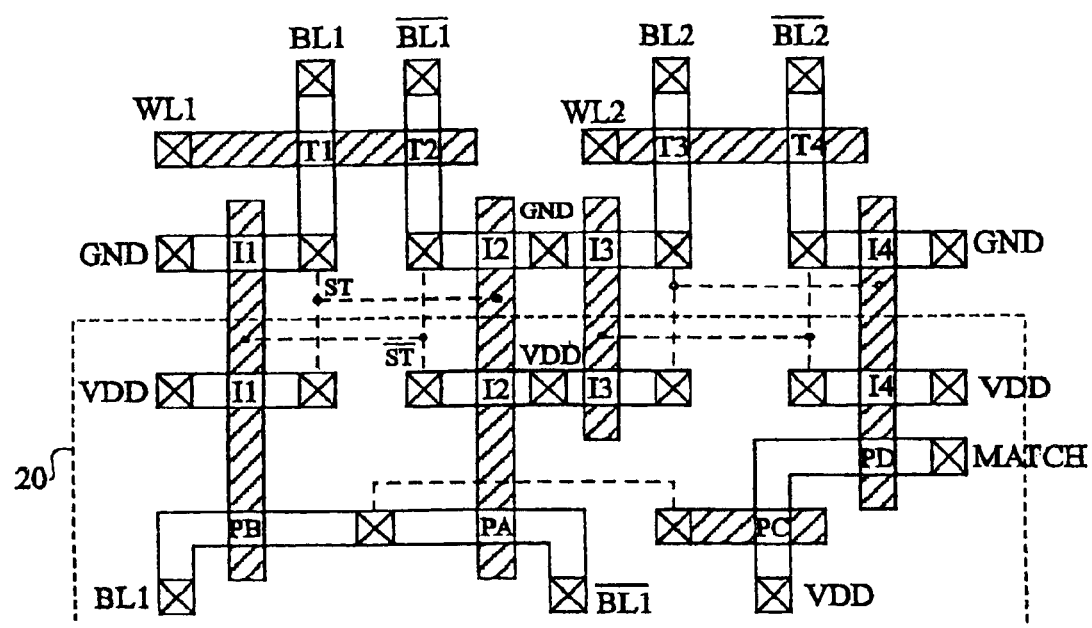
FIG. 6 shows a top view of an integrated circuit implementing the circuit of FIG. 5.

FIG. 6 shows a simplified top view of an integrated circuit implementation of the circuit of FIG. 5. The same type of representation as in FIG. 4 has been used in this drawing.

This circuit includes an equal number (8) of NPN and PNP transistors. All P-channel transistors are arranged in a same N well designated in the drawing by reference 20.

P-channel transistors I1 to I4 of inverters INV1 to INV4 and transistors PA, PB, PC, and PD are provided in N well 20.

N-channel transistors I1 to I4 of inverters INV1 to INV4 and transistors T1 to T4 of the storage cells are provided in the P substrate.

Figure 4:
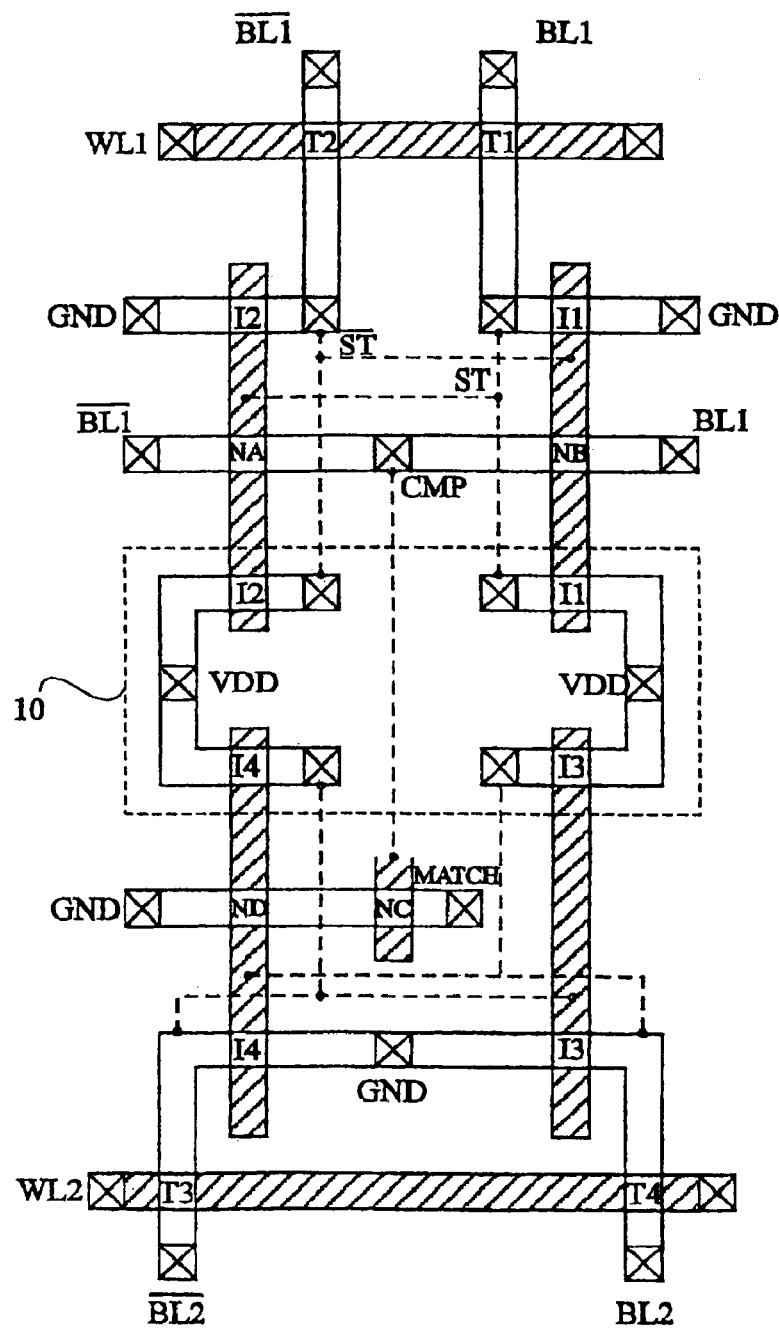
FIG. 4 shows a top view of an embodiment in integrated circuit form of the circuit of FIG. 1.

By examining FIG. 6, it can readily be seen that its structure is more compact that that of FIG. 4, especially due to the fact that the connection lengths are reduced and that many connection crossings are avoided. In particular, the connection between connection point CMP of transistors PA and PB and the gate of transistor PC is performed between neighboring components both located in the N well of the P-channel transistors whereas, in the diagram of FIG. 4, the corresponding connection between connection point CMP of transistors NA and NB and the gate of transistor NC is made by crossing the entire N well, which requires providing non-negligible guard distances.

Figures 7A, 7B:
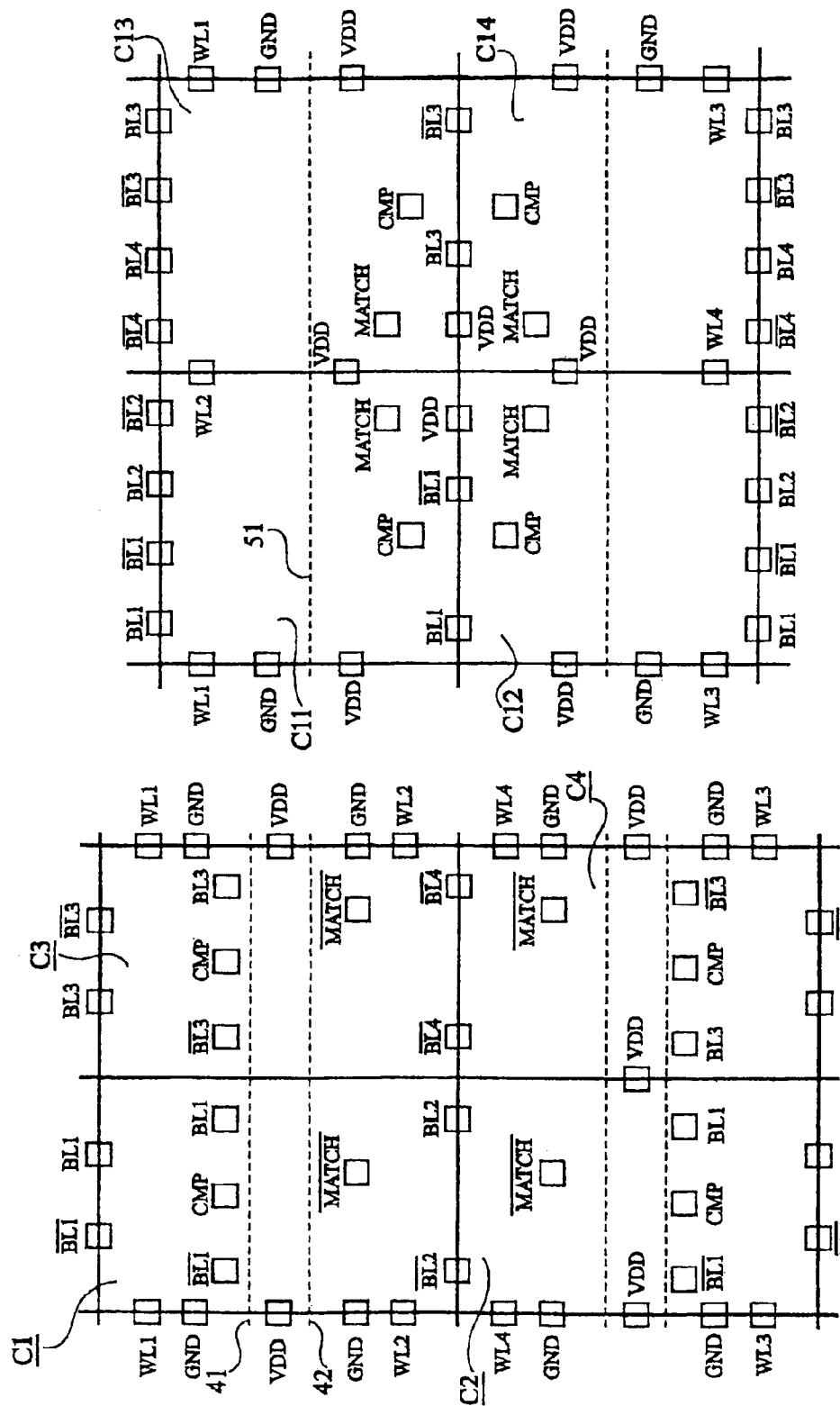
FIGS. 7A and 7B show cell assemblies according to prior art and according to the present invention to illustrate the advantages of the present invention.

Other advantages of the present invention will be indicated in relation with FIGS. 7A and 7B. FIG. 7A shows an assembly of four cells C1, C2, C3, C4, each of which corresponds to the prior art structure illustrated in FIG. 4. FIG. 7B shows an assembly of four cells C11, C12, C13, C14, each of which corresponds to the structure according to the present invention illustrated in FIG. 6.

Two additional advantages of the present invention will appear from these drawings, that is, a reduction of the number of pads and, on the other hand, a reduction of the number of separations between the N well and the substrate or between the N well and the P well.

In FIGS. 7A and 7B, pads internal to the cells and pads located at the cell periphery and shared with neighboring cells have been shown. Clearly, if the number of pads shared between neighboring cells is increased, the dimension is reduced since the number of corresponding pads is divided by two. This dimension reduction is significant, given that each pad occupies a non-negligible surface on the structure. It should more specifically be noted that pads BL1 and $\overline{BL1}$ internal to cells C1 and C2, as well as pads BL3 and $\overline{BL3}$ internal to cells C3 and C4, are not present in cells C11, C12, and C13, C14. In FIG. 7B, these pads are arranged at the limits between two neighboring cells. Their number is thus divided by two.

According to another advantage of the present invention, the number of borders between N wells, in which the P-channel transistors are formed, and the substrate (or P wells), in which the N-channel transistors are formed, is limited. As shown in FIG. 7A, in the structure of prior art, the N wells can extend in a cell row and include two borders 41 and 42 on either side of each extension in a cell row. According to the present invention, given that the N wells occupy half of a cell and extend in half of the underlying cell, the number of borders 51 extending along a cell row is divided by two with respect to prior art. This also results in a significant reduction of the cell dimensions, given that particular precautions must be taken at the border between an N region and a P region.

Of course, the present invention is likely to have various alterations, modifications, and improvements which will readily occur to those skilled in the art. Especially, various optimizations may be performed according to the manufacturing technology used.

Such alterations, modifications, and improvements are intended to be part of this disclosure, and are intended to be within the spirit and the scope of the present invention. Accordingly, the foregoing description is by way of example only and only as defined in the following claims and the equivalents is not intended to be limiting. The present invention is limited thereto.

What is claimed is:

1. A CAM cell with masking made in the form of an integrated circuit, including:
   a first storage cell arranged between two first bit lines, and including, in series, a first transistor, first and second inverters in anti-parallel, and a second transistor, gates of the first and second transistors being connected to a first word line;
   a comparison cell, including third and fourth transistors arranged between the first bit lines, a connection point of the third and fourth transistors controlling a fifth transistor, connected in series with a sixth inhibiting transistor between a result line and a bias voltage;
   a second storage cell, including, between second bit lines, a seventh transistor in series with two inverters in anti-parallel and an eighth transistor, the second storage cell controlling the inhibiting transistor;
   wherein the first, second, seventh, and eighth transistors are transistors having a channel of a first type, and the third, fourth, fifth, and sixth transistors are transistors with a channel of the opposite type.

2. The cell of claim 1, wherein the transistors having a channel of opposite type are P-channel transistors and are formed in a same N well.

3. The cell of claim 2, wherein the first, second, seventh, and eighth transistors, as well as the N-channel transistors of the inverters, are formed in a substantially aligned way and the P-channel transistors, as well as the P-channel transistors of the inverters, are formed in a substantially aligned way.

* * * * *

UNITED STATES PATENT AND TRADEMARK OFFICE
CERTIFICATE OF CORRECTION

| | | |
|---|---|---|
| PATENT NO. | : 6,995,997 B2 | Page 1 of 1 |
| APPLICATION NO. | : 10/862057 | |
| DATED | : February 7, 2006 | |
| INVENTOR(S) | : Richard Ferrant | |

It is certified that error appears in the above-identified patent and that said Letters Patent is hereby corrected as shown below:

On the title page, item (73) should be blank

Signed and Sealed this
Twelfth Day of June, 2012

David J. Kappos
*Director of the United States Patent and Trademark Office*